United States Patent [19]

Morgan-Smith

[11] 4,393,371

[45] Jul. 12, 1983

[54] ANALOGUE TO DIGITAL SIGNAL CONVERSION AND STORAGE SYSTEM

[75] Inventor: Peter J. Morgan-Smith, Hatfield, England

[73] Assignee: Morgan-Smith Electronics Ltd., Hatfield Herts., England

[21] Appl. No.: 264,232

[22] Filed: May 18, 1981

Related U.S. Application Data

[63] Continuation of Ser. No. 45,604, Jun. 5, 1979, abandoned.

[51] Int. Cl.$^3$ ............................................. H03K 13/02
[52] U.S. Cl. ............................ 340/347 AD; 328/151; 340/347 M; 340/347 SH; 358/138; 358/261; 360/32
[58] Field of Search .... 340/347 M, 347 SH, 347 AD, 340/347 CC; 328/151; 307/353; 360/32; 358/261, 138; 364/112

[56] References Cited

U.S. PATENT DOCUMENTS

| | | | |
|---|---|---|---|
| 2,978,535 | 4/1961 | Brown | 358/261 X |
| 3,324,237 | 6/1967 | Cherry et al. | 358/138 X |
| 3,383,461 | 5/1968 | Dryden | 358/138 |
| 3,753,133 | 8/1973 | Shumate | 340/347 AD X |
| 4,057,797 | 11/1977 | Jorgensen | 375/28 X |
| 4,101,881 | 7/1978 | De Freitas | 375/28 X |
| 4,132,947 | 1/1979 | Weischedel et al. | 328/114 X |
| 4,151,609 | 4/1979 | Moss | 365/221 |

FOREIGN PATENT DOCUMENTS

2344816 10/1977 France .

Primary Examiner—T. J. Sloyan
Attorney, Agent, or Firm—Lee, Smith & Jager

[57] ABSTRACT

In an analogue to digital converter, the analogue signal applied thereto is sampled at successive time intervals and at each sample a digital signal is produced and the time interval between successive samples is not necessarily constant but is dependent upon the rate of change of amplitude of the analogue signal during said time interval. The digital signals may be applied to a counter to produce data representative of the time interval between successive samples and also to indicate whether the analogue signal has increased or decreased between successive samples. This data may then be recorded in a manner to provide substantially constant recording density.

11 Claims, 6 Drawing Figures

ANALOGUE TO DIGITAL SIGNAL CONVERSION AND STORAGE SYSTEM

This is a continuation of application Ser. No. 045,604, filed June 5, 1979, abandoned.

The present invention relates to the digital conversion of analogue signals, for example, audio or video waveforms.

Existing A/D converters sample the analogue signal at a pre-determined rate higher than the highest frequency of interest in the waveform being processed. The instantaneous amplitude at the time of each sample is usually given a digital value which can subsequently be processed in serial or parallel form. An alternative method is for the converter to give an output according to whether or not the instantaneous amplitude of the signal waveform has increased or decreased since the previous sample time. This is known as 'Delta modulation.'

The sample rate has to be carefully chosen using existing systems because, if it is too low, then high frequency information on the original signal is lost and, if too high, processing and storage of the digital information is made more complicated and uneconomic.

The principal disadvantage of existing systems is that, when the analogue signal contains only low frequency components, or even pauses, the waveform is still being sampled at the same high rate as when the higher frequency components are present.

According to the present invention, in an analogue to digital converter, an analogue signal is sampled at successive time intervals and at each sample a digital signal is produced, the interval between successive samples being dependent upon the rate of change of amplitude of the analogue signal during said time interval.

The system offers a saving in bandwidth where the analogue waveform consists of low frequencies; together with good definition, where it is needed, when high frequency components are present.

As with any digital system, the analogue signal is divided into a number of discrete levels; the greater the number of levels, or 'steps', the closer the approximation to the original waveform, and the more digital 'bits' are needed.

The analogue signal sample is conveniently stored in analogue form in a 'Sample-and-Hold' circuit; the stored output is then compared with the varying input signal. Immediately after sampling, the output of the Sample-and-Hold and the analogue input signal are at the same level; after a time interval $t_1$, the difference between the analogue signal and the output of the store will be equal to the 'step' previously decided upon for the system. At this point, the Sample-and-Hold circuit is activated again, and stores the new level. The time between samples, $t_1$, is a function of the rate of change of amplitude of the analogue waveform. The time $t_1$ is subsequently converted to digital form, and the 'word' corresponding to $t_1$ is processed or stored, together with an extra bit which indicates whether the analogue signal stepped up or stepped down between the last sample points.

In the same way, the Sample-and-Hold is activated again when the analogue signal differs from the stored signal by the chosen amount. Another time interval $t_2$ converted to digital form, and this process is repeated ad infinitum, so that time periods $t_1, t_2 \ldots t_n$ are converted to digital form and, together with the information regarding the polarity of the step, are processed or stored as required.

As can now be seen, a series of 'words' is being generated at a variable rate, depending on the highest frequency content and amplitude of the analogue signal.

The Sample-and-Hold circuit conveniently consists of an electronic analogue gate (e.g. CD4016) and a capacitor, whereby the gate closes and opens again, momentarily connecting the capacitor to the signal line. The capacitor is charged to the instantaneous value of the analogue signal at the moment the gate is closed. The voltage across the capacitor is fed to a buffer of sufficiently high input impedance that it will not significantly affect the charge on the capacitor during the time period of interest. The voltage at the output of the buffer is the same as that at the input, i.e. it has unity voltage gain. However, the output impedance is low enough to interface suitably with subsequent circuitry.

A digital up-counter may also be provided, which counts in binary form from zero to, for example, 256 ($2^8$). This would be an 8-bit counter, the minimum count (zero) being 00000000, and maximum 11111111 (or 256 in decimal form). The counter has provision for being reset to its zero count whenever the Sample-and-Hold circuit samples the analogue signal. After the Sampling pulse, the counter will count up towards its maximum, and the counter output at any instant will be representative of the time which has elapsed since the Sample commenced. The rate of counting can be fixed, or the increments can correspond to a non-linear scale, changing as the count progresses.

The output of the Sample-and-Hold circuit already discussed is compared with the analogue input signal. While the analogue signal is close in voltage level to the output of the Sample-and-Hold circuit, the counter continues to count up. As soon as the analogue signal deviates from the stored level by more than a permitted amount in a positive or negative direction, the counter output will be stored, and the counter then reset to zero and Sample circuit actuated to store the new voltage level. This sequence will proceed ad infinitum. The counter output preceding each reset will be proportional to the time between Sample commands (although it may not be linearly related). Successive counter outputs are then stored, recorded, etc. as required.

DESCRIPTION OF THE PREFERRED EMBODIMENTS

A method of comparing levels will now be described in which positive and negative offsets are added to the analogue signal.

Figure 1:
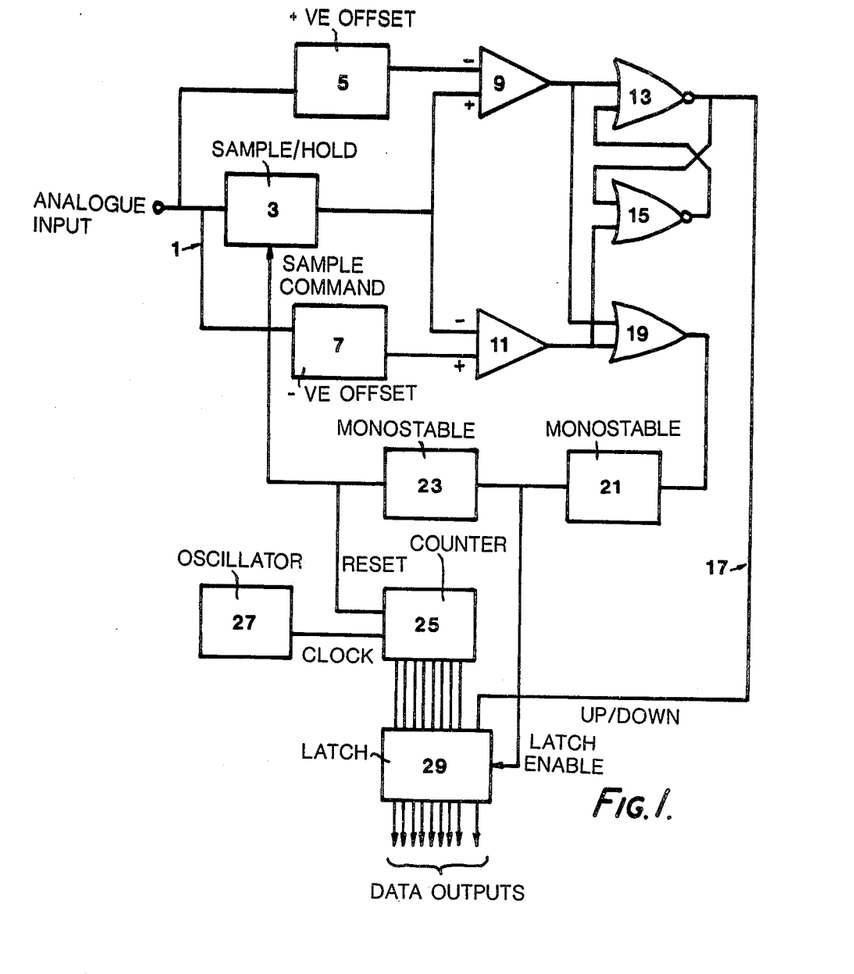
FIG. 1 is a circuit drawing of an A to D converter according to the invention.

FIG. 1 of the accompanying drawings is a circuit diagram of an A/D converter according to the invention, Referring to FIG. 1, an analogue signal is applied on an input line 1 which is connected to a Sample-and-Hold circuit 3, a +ve offset circuit 5 and a −ve offset circuit 7. The output from the offset circuit 5 is connected to the inverting input of a comparator 9 and the other input of the comparator is connected to the Sample-and-Hold circuit 3. Similarly, the circuit 3 is connected to the inverting input of a comparator 11 and the output of the offset circuit 7 is connected to the other input of the comparator 11. A pair of NOR gates 13, 15 are connected as a latch and an output from the latch is taken on a line 17. The output from the comparator 9 is connected to one input of NOR gate 13 and to one input of an OR gate 19. The output from the comparator 11 is connected to one input of NOR gate 15 and to the other input of OR gate 19. The output from the OR gate 19 is connected to the input of a monostable trigger circuit 21 and the output of this circuit is connected to a latch 29, and also to a monostable trigger circuit 23. The output of monostable 23 is connected to the Sample-and-Hold circuit 3, and to the reset input of a counter 25. An oscillator 27 is connected to the clock input of counter 25, and the counter outputs are connected to the inputs of latch 29.

Positive and negative offsets are added to the analogue signal; in other words, the output of the offset circuit varies with the analogue input, but is shifted so that it is always more positive or more negative respectively than the analogue input signal. The analogue signal shifted in a positive direction is applied to the inverting input of comparator 9, and that in a negative direction to the non-inverting input of the comparator 11. As the analogue input signal reduces below the stored voltage, (i.e. more negative) a point is reached where the output of the positive offset circuit drops below the Ssmple/Hold voltage, and the comparator 9 is actuated, its output going high. If the analogue input signal rises, then the same occurs with the negative offset circuit and associated comparator 11. When either comparator is actuated, the monostable circuit 21 is triggered via OR gate 19 and applies a pulse to the following monostable circuit 23, which is triggered by the trailing edge of the output of monostable 21. The pulse generated by monostable 23 is applied to the Sample/Hold circuit 3 to store the new level, and also resets counter 25. The actuation of the Sample/Hold circuit immediately restores the comparators to their quiescent state, and removes the trigger input from the monostable 21. The two NOR gates 13, 15, connected as a latch, indicate on line 17 which comparator was last actuated, and therefore whether the analogue signal was going positive or negative with respect to the stored level, during the last time period.

As oscillator 27 applied to the clock input of counter 25 causes the counter to advance until reset, the count at a particular moment is representative of the elapsed time since the counter was last reset. The operation of data latch 29 by monostable 21 retains the count at the moment of interest, so that the data appears at the output of latch 29 after the pulse from monostable 21 has disappeared. The output from NOR latch 13 and 15 (the step up/down information) is also retained in latch 29 with the outputs from counter 25. After the data has been stored in latch 29 by the action of monostable 21, monostable 23 resets the counter 25 resetting the outputs to zero, and actuates the Sample/Hold as already described.

It should be noted that instead of latching the data into latch 29, it is equally feasible to write it straight into memory, but for the purpose of example it is preferable to show a latch circuit. Additionally, the time periods of the monostable pulses should be short enough to be insignificant in relation to the shortest period between sampling pulses.

It should be noted that if the offset voltage was fixed and unrelated to the input signal, then voltage increments in relation to small signals might be considered excessive as could Sampling rates for large signals. The offset can alternatively be related to the deviation of the analogue signal from its centre (quiescent) level, for example.

The circuit described above would operate in a similar way if the offsets were applied to the output of the Sample-and-Hold circuit, instead of to the analogue input signal. In this case polarities would be reversed, so that the output of the −ve offset circuit would be applied to comparator 9 and the +ve to comparator 11.

The data can be stored in a semiconductor memory, for example, and easily retrieved at the rate required to reconstitute the analogue signal. If greater amounts of storage are required, however, longitudinal storage methods, such as, for example, optical or magnetic tape or disc, have to be considered. A difficulty arises in the most efficient use of the storage medium. The digital outputs corresponding to the time periods between samples, i.e. $t_1$, $t_2$, $t_n$, appear at irregular intervals, and if the storage medium is scanned at a constant rate, then the advantages of the invention are lost. It is necessary to store the information at a constant density, which implies that the rate of scanning of the recording medium would change according to the state of output of digital information (which in turn varies according to the high frequency content of the analogue signal).

When recording (whatever the medium) it is obviously desirable to achieve the maximum recording density, and this is particularly so with digital systems, which normally are much less economical of recording medium than analogue systems. With a conventionally encoded digital system, the "data rate" is constant and the speed of the recording medium can be chosen accordingly. With the system of the present invention, the output of digital information from the converter is not at a constant rate, but depends on the content of the original analogue signal. To get a constant recording density, it would be necessary to alter the speed of the recording medium according to the data rate.

The drive speed of such systems cannot be altered instantly to suit the incoming data rate, but will alter more slowly due to the inertia of a mechanical system. The solution is to use a semiconductor memory to smooth out the fast changes in bit rate, allowing the mechanical drive speed to respond to the average data rate. A suitable device is a First in—First out (FIFO) register such as RCA CD40105B. The operation of this device is such that data entered ripples through the register to the first available location not already filled with previously entered data. Data may be unloaded at a rate independent of the rate at which data is entered. FIFO devices may be cascaded to form a longer register (the length is dependent on the speed of response of the mechanical drive system—the register must be long enough not to overflow when the data rate changes from minimum to maximum) or underflow vice versa. The word width may be also expanded by using parallel FIFOS.

A control output can be derived from a register consisting of cascaded FIFOS, which will indicate whether the register is more or less than, for instance, half full. This control signal can be used to increase or decrease the speed of the recording medium. Data is removed from the register at a rate determined by the actual speed of the recording medium. Therefore, as soon as the register starts to fill up beyond the chosen level, the motor drive will be speeded up, and the increased speed of the recording medium will unload data from the register at a faster rate. The level of data in the register will therefore recede to the average mid-position. The register is therefore buffering the recording system against the higher speed variations in data rate, and the drive speed of the recorder is responding, at a slower rate of change, to the average data rate of the converter.

Figure 2:
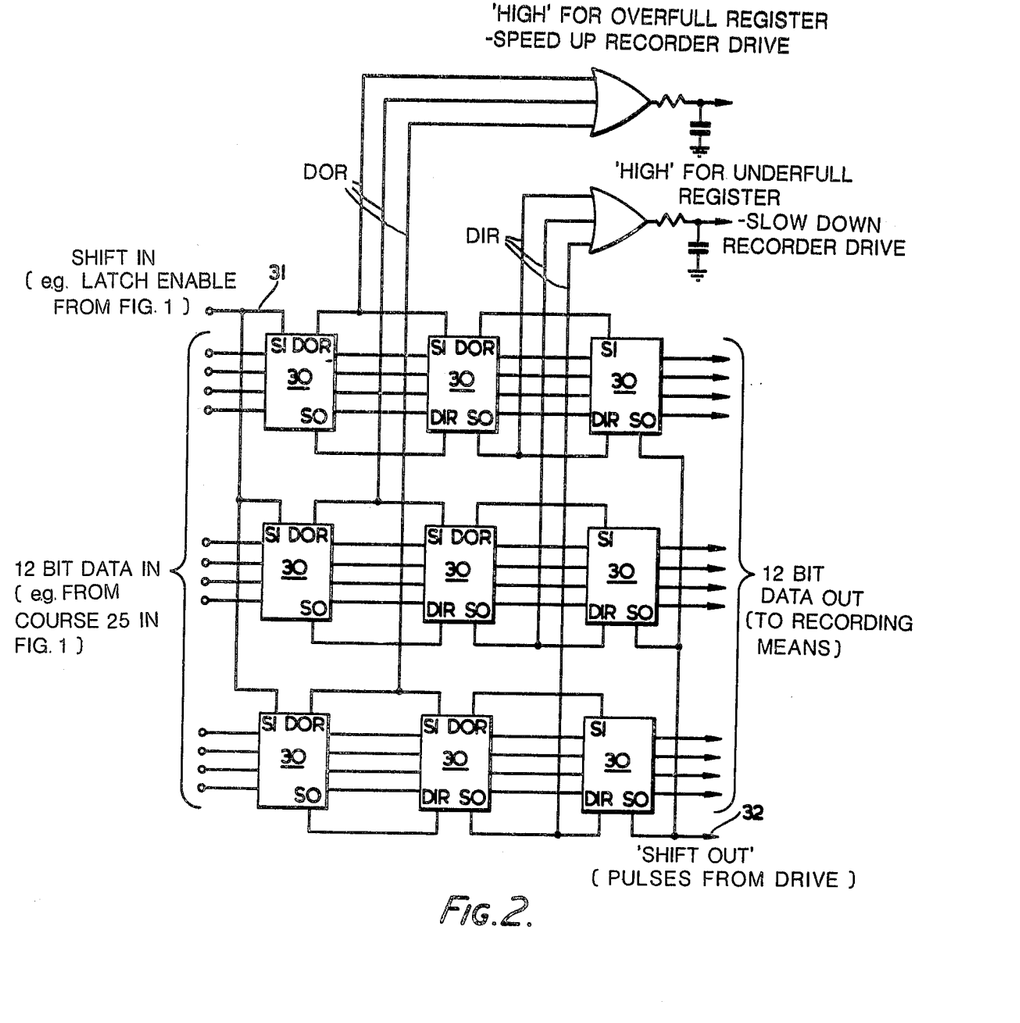
FIG. 2 is a circuit for recording data from the A to D converter of FIG. 1.

FIG. 2 of the accompanying drawings shows a circuit for recording data from the A/D converter at a substantially constant recording data. A register consists of nine RCA CD40105B FIFO devices 30 connected to form a register 12 bits wide by 48 bits long. When the "shift in" line 31 is actuated, data present at the data input is entered into the register and ripples through towards the output until it reaches an empty location. When the "shift out" line 32 is actuated, data is shifted out of the register and all the data in the register is shifted towards the output. Therefore, within the limits set by the length of the register, data can be entered at a faster or slower rate than it is being removed. If it is assumed that the register is receiving data from counter 25 shown in FIG. 1, then latch 29 is not needed and the latch enable pulse will be used to enter data by connecting it to "shift in" line 31 of the register.

At the same time, as the rate of recording data is dependent on the speed of the drive mechanism, clock pulses derived from the drive mechanism, and thus related to the instantaneous velocity of the recording medium, are connected to the "shift out" line 32 to clock out data from the "data out" lines of the register to be recorded on the recording medium. At the same time signals are derived from the "data out ready" lines DOR of the register and "data in ready" lines DIR of the register, which indicate whether the register is tending to overfill or empty and these signals are used to speed up or slow down the drive mechanism respectively. The overall result is to record at an approximately constant bit rate, despite an input to the register which may vary widely in data rate.

To retrieve data from the recording medium, a FIFO register is conveniently used to perform a similar function to that used to record the data. The data is read from the register at a rate determined by the data itself, and the storage mechanism replay speed (and therefore the rate at which data is written into the buffer memory) is determined by the average rate of data reading.

Figure 3:
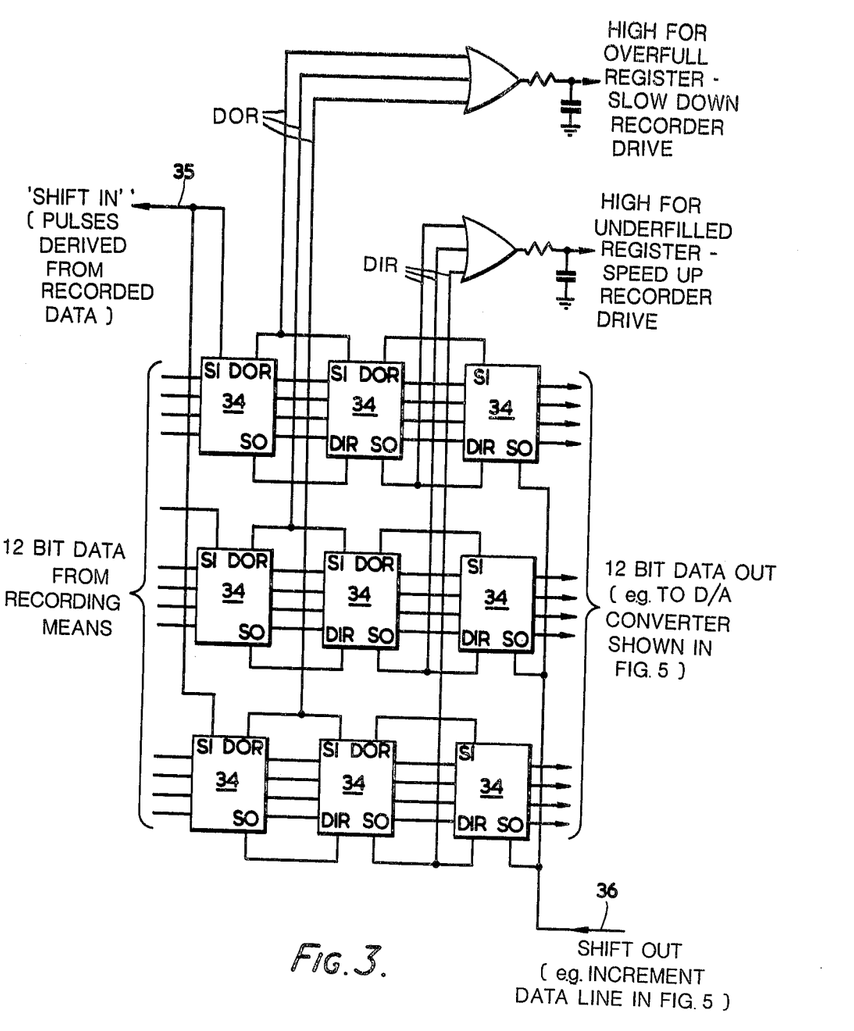
FIG. 3 shows a data retrieval circuit.

FIG. 3 of the accompanying drawing shows a circuit for retrieving data which has been stored at a substantially constant density.

A register consists of nine RCA CD40105B FIFO devices 34 connected to form a register 12 bits wide by 48 bits long.

The data input is now received from the recording means and "shift in" instructions on line 35 are received from the recorded data. For a given speed of the recording medium, data is therefore being entered into the register at a substantially constant rate. The data output is connected to a circuit for conversion to an analogue signal. Data is now shifted out of the register by the line increment data line 36 which is connected to the register shift out line 50. The data rate is dependent on the time information encoded in the data itself. Outputs on register output lines DOR and DIR indicate when the register output lines DOR and DIR indicate when the register tends to overfill or empty and these are used to control the speed of the drive mechanism. An overfill signal will be used to slow down the drive and underfill to speed it up. The result is that the constant data density of the recording medium is converted to irregular data containing time information.

D/A conversion of the data to recover the analogue waveform is straightforward. A simple method is to step a counter up or down by one count after a time period determined by the digitally encoded data ($t_1$, $t_2$) and then the counter output can be decoded conventionally using for instance a resistive ladder network.

Figure 4:
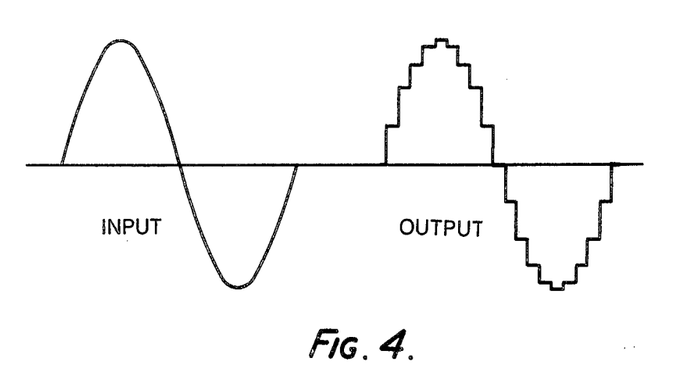
FIGS. 4 and 5 are circuit diagrams showing input and output wave forms.

The output in this case, as with a conventional system, is a stepped approximation to the original waveform as shown in FIG. 4 of the accompanying drawing and which can be passed through a low-pass filter network to remove the clock frequency harmonics.

An improved method is to increase or decrease the charge stored on a capacitor at a rate proportional to the time T (i.e. $t_1$, $t_2$ ... $t_n$). Thus, whatever the value of T, the charge/discharge current will alter the voltage on the capacitor by 1 output step during the period T.

Figure 5:
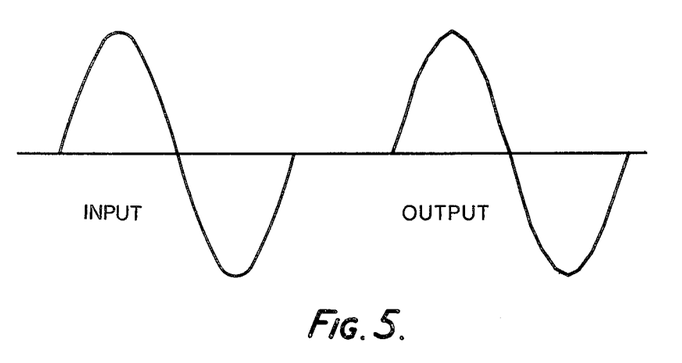

Instead of a series of steps, the original Sample points will be connected by straight lines as shown in FIG. 5 of the accompanying drawing thereby reducing the harmonic content and making subsequent filtering simpler and more effective.

Figure 6:
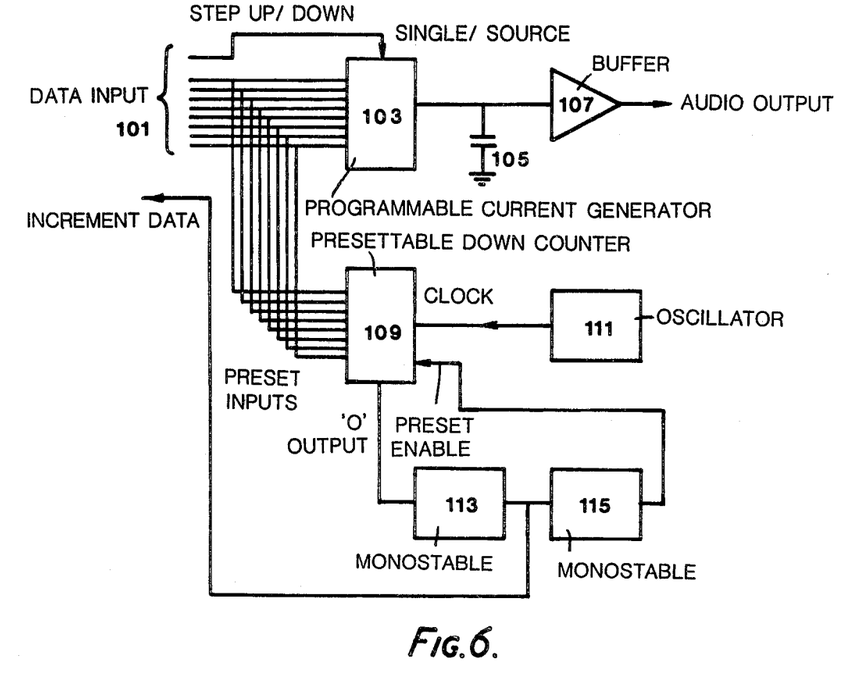
FIG. 6 shows a circuit for converting store data signals back to an analogue signal.

FIG. 6 of the accompanying drawings is a circuit diagram showing how the data signals representing time intervals and step up/down instruction as previously described can be converted back to an analogue signal.

A programmable current generator 103 is provided, whose output current magnitude is determined by the encoded time interval at the data input, and polarity by the up/down control input. Thus, the current generator will cause current to flow into or out of a capacitor 105, increasing or decreasing the charge on the capacitor and thus, the voltage across the capacitor. A buffer 107 is provided, which has such a high input impedance that it will not significantly affect the charge on capacitor 105 during time intervals of interest.

Any voltage variations at the input of buffer 107 appear at its output, with or without amplifications. The shorter the time interval represented by data at the input 101, the higher will be the current flowing into or out of the capacitor 105 and the faster the rate of change of voltage at the input (and therefore the output) of the buffer 107.

The data input is also applied to the preset input of a presettable down counter 109, which might comprise one or more CD40103 or similar. An oscillator 111 is provided, normally of the same frequency as that used when encoding. The oscillator causes counter 109 to count down until it reaches zero count, when the '0' output will trigger a monostable 113. The output pulse of monostable 113 is used to increment the next 'word' so that fresh data appears at data input 101, retrieved from external circuitry such as a semiconductor memory. The trailing edge of the pulse from monostable 113 triggers a monostable 115, and the pulse output from monostable 115 actuates the preset enable input of the counter 109. The new data at data 101 is preset into the counter, and the counter continues to count down from this count towards zero again. This process continues ad infinitum.

The result is that a facsimile of the originally encoded analogue signal appears at the output of the buffer 107.

It is not always necessary to make the value of the digitally coded time period linearly proportional to T; in fact this may be a disadvantage in some instances. In digitally encoded speech, for instance, the space between words can be allotted special time codes to denote a long pause, unrelated to the sampling time in normal encoding. In processing video signals, a particular code can both trigger the generation on replay of, for instance, a flyback pulse, and generate the appropriate delay.

In general, the linearity of the amplitude steps, and of the time periods T, between input and output, can be modified to suit particular end uses, for instance to achieve compression or expansion of the input signal, or to optimise the use of the storage medium.

When decoding video signals, for instance, arrangements have to be made for the encoded line and frame timing signals to be recognised, and it might be thought that these are so important that very complicated error protection arrangements have to be made. However, as the video signals are encoded with respect to time, they can be summed until the total equals the duration of a line (or frame). The next word received should be the line (or frame) signal code. A check can thus be carried out and arrangements made to insert missing codes, without the complexity of parity bits, etc., which a conventional system would require. For added protection, the enclosed line (or frame) signal can be repeated, and still use much less recording medium that a system working in 'real time' (whether analogue or digital) where the whole duration of line and frame pulses, flyback periods, etc., has to be recorded.

An additional saving can be made on typical video systems by not recording lines (or frames) which are not used or not seen on the final picture, an approach which is impossible with conventional techniques.

If it is required to interface with a digital system using a fixed clock rate, it is straightforward to convert from the system described here to a conventional system, where an amplitude-related code is generated at each clock interval. In this instance, the time delay T between Sampling should be an exact multiple of a chosen clock rate, and the data, after retrieval from the storage medium, will control an up-down counter as previously described.

The digital output of the counter, representing the amplitude of the analogue signal in binary form, can now be read out at each clock period as required. The advantages of compact storage of the data are fully retained.

It is additionally possible to reverse the above procedure; if using conventionally encoded material, the same digital code is present for more than one clock pulse, then the number of clock periods for which the data remains the same can be counted, and this count, representing time T, together with whether the data output increases or decreases on the next clock pulse, can be processed as previously described.

During encoding of an analogue signal, it is also possible to combine the present invention with conventional digital encoding, so that the stream of 'words' will represent consecutively either the time between samples, T, as described, or (where the analogue signal contains high frequency, high amplitude components), the digitally encoded amplitude. One 'bit' of the output words is set aside to indicate which is being represented.

This realisation of the invention requires more complex processing when encoding for optimum results, but e.g. for systems designed for replay only of mass produced digitally stored analogue material, may provide the most efficient utilisation of recording media.

The use of this A-D/D-A system for processing and storing audio and video signals has already been mentioned n passing.

Another application is as an oscilloscope waveform store to extend the low frequency use of the equipment. Existing digital stores use random access memories or shift registers; the waveform is sampled at regular time intervals. The use of the new system detailed herein will give a better combination of definition and sample rate, as the sampling rate will be high where sampled levels are changing rapidly, and low where they are changing little.

For digital speech synthesis, where speech sounds are created by mixing varying levels of oscillator and noise generator outputs, etc., the control signals can be conveniently digitised using the above techniques, multiplexed if required and stored using semiconductor memories or other means.

Other applications are numerous; e.g. many industrial monitoring situations require analogue signals to be digitised and stored; especially where the activity of the process being monitored is sporadic, the system described can make considerable savings in recording medium without sacrificing the recording of detailed information when needed.

We have so far looked at the encoding and decoding of individual signals, but there are many applications where it is necessary to process several signals together. This is easily done by adding extra identification bits to the data signal available. The encoding circuit, e.g. that of FIG. 1, would be repeated for each input. Data being latched into latch 29 of each of the encoders at an irregular rate, the fixed identify bits would be added, and the complete data words from all the encoders entered into a memory etc., according to the application. This could be implemented by the counter 25 reset pulse, which occurs after the latch enable pulse.

However, if reset pulses occur simultaneously in two or more encoders, provision would be made for them to be delayed and read in sequence. It should also be arranged so that even if all encoders have to be read in sequence as described, the monostable pulses are short enough for the operation to be completed before new data is written into the latch 29, when the time delay between samples is at its shortest.

The individual signals are now multiplexed into a single digital code, and can be processed as such until it is required to separate them and recover the original waveforms. When subsequently separating the multiplexed signal into its component parts, the identification bit(s) are used to gate data to separate registers corresponding to the individual signals, where they can be individually processed as already described.

I claim:

1. An analogue-to-digital signal conversion and storage system including means for sampling the analogue signal at successive time intervals and producing at each sample a digital signal, the interval between successive samples being dependent upon the rate of change of amplitude of the analogue signal during said time interval, timing means for determining the time interval between successive samples, storage means including a data buffer to which data from the system is supplied and from which data is applied to a recording means, the speed at which data is stored in the recording means being variable, and means for producing a control signal for adjusting said speed in response to the amount of data stored in the buffer, said signal being arranged to prevent overload of the buffer.

2. An analogue-to-digital signal conversion and storage system as claimed in claim 1, in which the analogue signal is sampled when the instantaneous amplitude of the signal changes by a predetermined amount from the instantaneous amplitude of the signal at the previous sample.

3. An analogue-to-digital data conversion and storage system as claimed in claim 1, including means for converting said stored data to an analogue signal.

4. An analogue-to-digital signal conversion and storage system as claimed in claim 1, in which the storage means includes means for scanning the storage medium at a variable speed related to the frequency content of the analogue signal.

5. An analogue-to-digital signal conversion and storage system as claimed in claim 2, in which the predetermined change in amplitude is variable.

6. An analogue-to-digital signal conversion and signal system as claimed in claim 3, in which the means for converting said storage data to an analogue signal includes a current generator whose output current is determined by the data input thereto and a capacitor arranged to receive the output of said generator.

7. An analogue-to-digital conversion and storage system as claimed in claims 1, 2 or 5, further comprising a sample-and-hold circuit having an input for receiving the analogue signal, means for applying positive and negative offset signals to the analogue signal and means for comparing the output of the sample-and-hold circuit with the output of said offset means for producing a first digital signal when the output of the sample-and-hold circuit and that of the offset means bear a predetermined relationship and a second digital signal representative of the polarity of the change in instantaneous amplitude of the analogue signal since the preceeding sample.

8. An analogue-to-digital signal conversion and storage system as claimed in claims 1, 2 or 5 further comprising a sample-and-hold circuit having an input for receiving the analogue signal, means for applying positive and negative offset signals to the output of the sample-and-hold circuit and means for comparing the analogue signal with the output of said offset means and for producing a first digital signal when the analogue signal and the output of the offset means bear a predetermined relationship and a second digital signal representative of the polarity of the change in instantaneous amplitude of the analogue signal since the preceeding sample.

9. An analogue-to-digital converter as claimed in claim 7, including a counter to which the first digital signals are applied, the counter producing data representing the time between successive samples.

10. An analogue-to-digital converter as claimed in claim 8, including a counter to which the first digital signals are applied, the counter producing data representing the time between successive samples.

11. An analogue-to-digital signal conversion and storage system as claimed in claim 9, including a semiconductor memory in which both the output data from the counter and data representative of the second digital signals is stored.

* * * * *